US008079667B2

(12) United States Patent
Young et al.

(10) Patent No.: US 8,079,667 B2
(45) Date of Patent: Dec. 20, 2011

(54) DROP GENERATING APPARATUS

(75) Inventors: Michael Y. Young, Cupertino, CA (US); Patrick C. Cheung, Castro Valley, CA (US); Stephen David White, Santa Clara, CA (US); John R. Andrews, Fairport, NY (US); David J. Gervasi, Pittsford, NY (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 379 days.

(21) Appl. No.: 12/338,169

(22) Filed: Dec. 18, 2008

(65) Prior Publication Data

US 2010/0156997 A1 Jun. 24, 2010

(51) Int. Cl.

| | |
|---|---|
| ***B41J 2/14*** | (2006.01) |
| ***B41J 2/05*** | (2006.01) |
| ***B41J 2/045*** | (2006.01) |

(52) U.S. Cl. ................................ 347/50; 347/58; 347/68

(58) Field of Classification Search .................... 347/50, 347/58, 68–72

See application file for complete search history.

(56) References Cited

U.S. PATENT DOCUMENTS 5,010,355 A 4/1991 Hawkins et al.
6,151,045 A * 11/2000 Beach et al. .................... 347/45
6,256,053 B1 * 7/2001 Noshita ........................ 347/203
6,491,384 B2 * 12/2002 Usui et al. ....................... 347/70
7,066,582 B2 * 6/2006 Deguchi et al. ................. 347/68
7,168,791 B2 1/2007 Hoisington et al.
2005/0024396 A1 * 2/2005 Farr ................................. 347/7

FOREIGN PATENT DOCUMENTS

WO WO 2004/110768 A1 * 12/2004

OTHER PUBLICATIONS

McGraw Hill, Publisher, 1970, USA, “Plastic Coatings for Electronics,” by James J. Licari, pp. 1-56.

McGraw Hill, Publisher, 1970, USA, “Plastic Coatings for Electronics,” by James J. Licari, pp. 57-84 and 106-114.

http://www/e[a/gpv/ttn/chief/ap42/ch04—Technology Transfer Network Clearinghouse for Inventories & Emission Factors, AP42, Fifth Edition, vol. 1, Chapter 4: Evaporation Loss Sources, Section 4.2.2.3, Apr. 1981.

http://www.aqmd.gov/rules/rulesreq.html—South Coast Air Quality Management District Rules and Regulations, Rule 1126, “Magnet Wire Coating Operations”, Amended 1995.

* cited by examiner

*Primary Examiner* — Geoffrey Mruk

(74) *Attorney, Agent, or Firm* — Marger Johnson & McCollom, P.C.

(57) ABSTRACT

A drop generator having a via structure configured for electrical and fluidic interconnection. The via structure includes an electrically conductive layer and an electrically insulating layer disposed on the electrically conductive layer.

19 Claims, 3 Drawing Sheets

DROP GENERATING APPARATUS

BACKGROUND

The subject disclosure is generally directed to an electrical signal conducting, fluid conveying via structure that can be employed for example in drop generating apparatus such as drop jetting devices.

Drop on demand ink jet technology for producing printed media has been employed in commercial products such as printers, plotters, and facsimile machines. Generally, an ink jet image is formed by selective placement on a receiver surface of ink drops emitted by an array of drop generators implemented in a printhead or a printhead assembly. For example, the printhead assembly and the receiver surface are caused to move relative to each other, and drop generators are controlled to emit drops at appropriate times, for example by an appropriate controller. The receiver surface can be a transfer surface or a print medium such as paper. In the case of a transfer surface, the image printed thereon is subsequently transferred to an output print medium such as paper.

A known ink jet drop generator structure employs an electromechanical transducer, and making electrical and fluidic connections can be difficult, particularly as the density of drop generators is increased for increased dot resolution.

DETAILED DESCRIPTION

Figure 1:
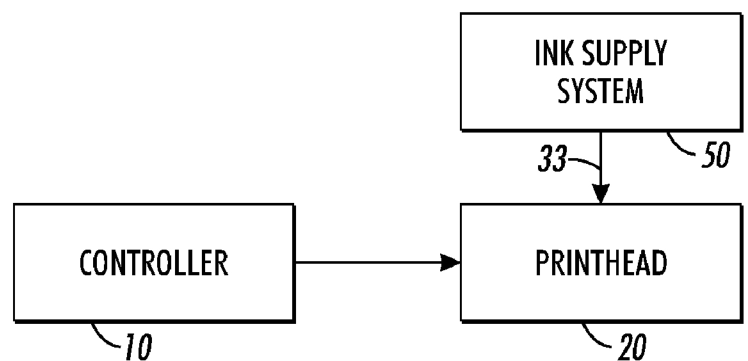
FIG. 1 is a schematic block diagram of an embodiment of a drop-on-demand drop emitting apparatus.

FIG. 1 is schematic block diagram of an embodiment of a drop-on-demand printing apparatus that includes a controller 10 and a printhead assembly 20 that can include a plurality of drop emitting drop generators. The printhead 20 receives ink 33 from an ink supply system 50 that can comprise at least one on-board ink reservoir and/or at least one remote ink reservoir. The controller 10 selectively energizes the drop generators by providing a respective drive signal to each drop generator. Each of the drop generators can employ a piezoelectric transducer. As other examples, each of the drop generators can employ a shear-mode transducer, an annular constrictive transducer, an electrostrictive transducer, an electromagnetic transducer, or a magnetorestrictive transducer.

Figure 2:
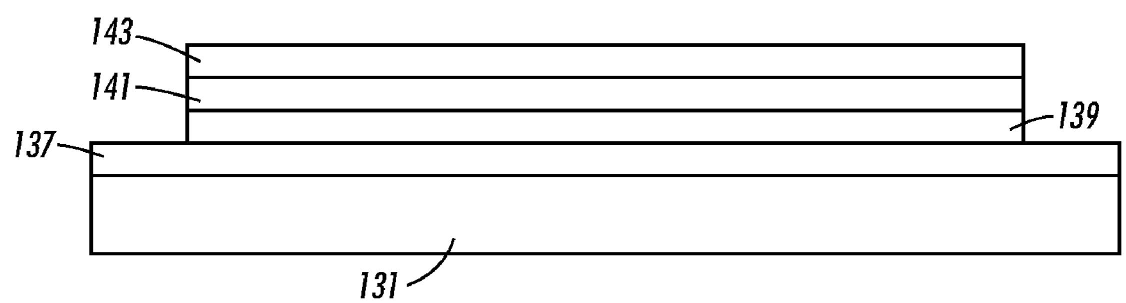
FIG. 2 is a schematic elevational view of an embodiment of an ink jet printhead assembly.

FIG. 2 is a schematic elevational view of an embodiment of an ink jet printhead assembly 20 that can implement a plurality of drop generators 30 (FIG. 3), for example as an array of drop generators. The ink jet printhead assembly includes a fluid channel layer or substructure 131, a diaphragm layer 137 attached to the fluid channel layer 131, a transducer layer 139 attached to the diaphragm layer 137, a circuit carrying/supporting substrate 143, and an interconnect structure 141 disposed between the circuit carrying substrate 143 and the substructure comprising the transducer layer 139, the diaphragm layer 137, and the fluid channel substructure 131. By way of illustrative examples, the circuit carrying/supporting substrate 143 can comprise a printed circuit board, a flexible printed circuit, a ceramic substrate, a plastic substrate, a glass substrate, or a thin film substrate.

Figure 3:
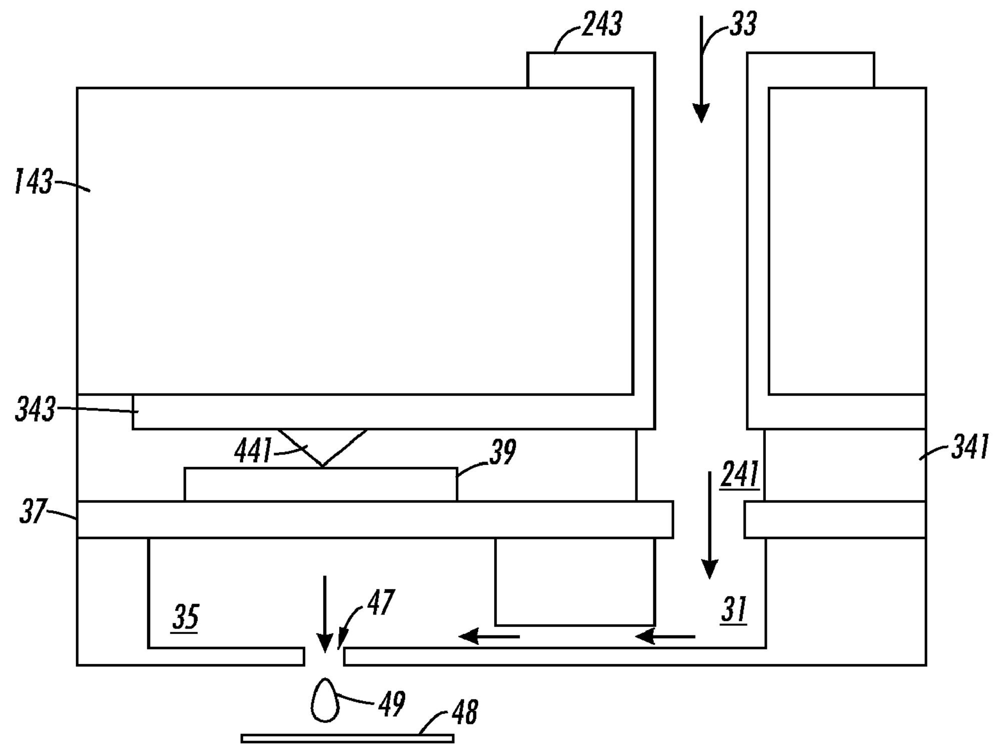
FIG. 3 is a schematic block diagram of an embodiment of a drop generator that can be employed in the drop emitting apparatus of FIG. 1.

As described further herein relative to FIG. 3, the fluid channel layer 131 can implement the fluid channels and chambers of the drop generators, while the diaphragm layer 137 can implement diaphragms of the drop generators. The transducer layer 139 can implement the electromechanical transducers of the drop generators. By way of illustrative example, fluid channel substructure 131 can be formed of a stack of laminated sheets or plates, such as of stainless steel.

As also described further herein relative to FIG. 3, the circuit carrying substrate 143 feeds through the interconnect structure 141 electrical drive signals/waveforms to the transducer layer 139 as well as ink to the fluid channel layer 131. In other words, the interconnect structure 141 provides fluidic and electrical interconnection between the circuit carrying substrate 143 and the transducer layer 139 and the fluid channel layer 131.

FIG. 3 is a schematic block diagram of an embodiment of a drop generator 30 that can be implemented in the printhead assembly 20 of the printing apparatus shown in FIG. 1. The drop generator 30 includes an inlet channel 31 that receives ink 33 from the ink supply system 50 (FIG. 1) through a via structure 243 formed in the circuit carrying substrate 143 and an opening 241 in a standoff 341 of the interconnect structure 141 (FIG. 2). The ink 33 flows into an ink pressure or pump chamber 35 that is bounded on one side, for example, by a flexible diaphragm 37 that can comprise metal such as stainless steel.

An electromechanical transducer 39 is attached to the flexible diaphragm 37 and can overlie the pressure chamber 35, for example. A contact element 441 of the interconnect structure 141 electrically connects the electromechanical transducer 39 to a contact pad 343 on the circuit carrying substrate 143. Electrical actuation of the electromechanical transducer 39 causes ink to flow from the pressure chamber 35 to a drop forming nozzle or orifice 47, from which an ink drop 49 is emitted toward a receiver medium 48 that can be a transfer surface or an output medium such as paper, for example.

The ink 33 can be melted or phase changed solid ink, and the electromechanical transducer 39 can be a piezoelectric transducer that is operated in a bending mode, for example.

By way of further examples, the contact element 441 can comprise silver epoxy or a conductive silicone adhesive.

Generally, the via structure 243 is configured to conduct electrical signals, for example to the electromechanical transducer 39, and also to convey liquid from one side of the circuit carrying substrate 143 to the other side.

Figure 4:
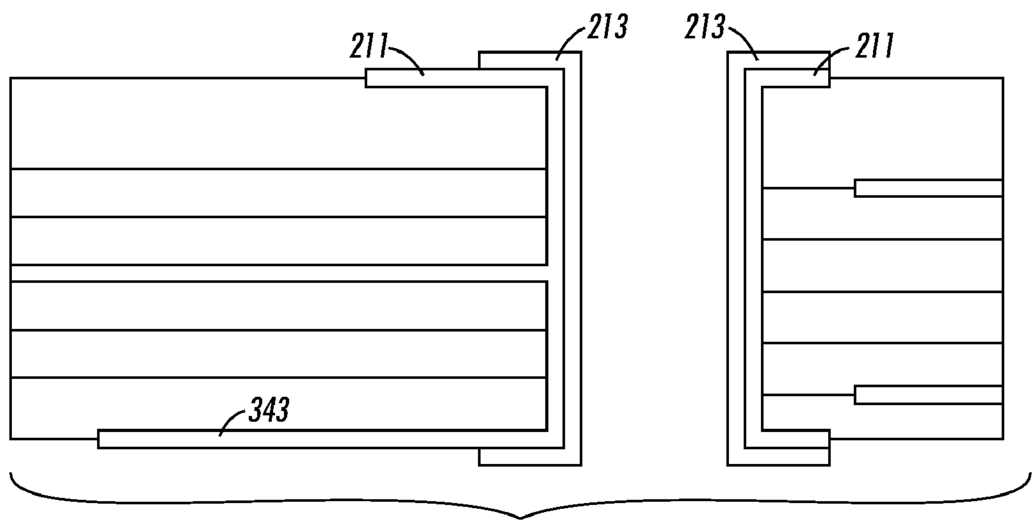
FIG. 4 is a schematic view of an embodiment of a via structure that is configured for electrical and fluidic interconnection.

Referring now to FIG. 4, the via structure 243 can comprise a an electrically conductive layer 211 disposed in an opening in the circuit carrying substrate 143, for example extending from a first side to second side of the circuit carrying substrate 143, and a dielectric or electrically insulating layer 213 disposed on the electrically conductive layer 211. The dielectric layer 213 functions to prevent direct liquid contact with the electrically conductive layer 211, and is of sufficient extent to prevent liquid flowing the via structure from coming into contact with the conductive layer 211. An exposed portion of the conductive layer 211 on the second side of the circuit carrying substrate 143 can comprise the contact pad 343.

Electrically insulating the electrically conductive layer 211 can be beneficial in applications wherein a ground plane is close to the electrically conductive layer 211, for example wherein the diaphragm layer 137 (FIG. 3) comprises a metallic ground plane. In such applications, the electrical insulation can prevent the formation of an electrochemical cell with electrical conduction and electrically-induced corrosion between an electrically active via and the ground plane.

The dielectric layer 213 can be realized by an organic or inorganic coating or film that can be conformal.

Examples of organic coatings include Parylene, polytetrafluorethylene, and polyurethane. Organic coatings generally can be thermally vapor deposited, although Parylene vapor deposition is performed at close to room temperature. By way of illustrative example, a Parylene coating can be hardened or annealed using thermal or radiation means.

Examples of inorganic coatings include anodic films that are formed from anodization of metals such as aluminum, tantalum, titanium, zinc, magnesium and niobium. Anodization is an electrolytic passivation process that increases the thickness of the natural oxide layer on the surface of metals, and can produce good electrical insulators that have been used as dielectric films for electrolytic capacitors. Depending on the metal and the electrolyte solution used in the anodization process, a sealing substance may be applied to the anodized surface to seal the porous film and improve corrosion resistance. For example, anodizing aluminum using chromic, sulfuric, phosphoric or organic acid baths may produce aluminum oxide films that are porous and may require a post anodization sealing process step. Aluminum oxide substantially free of pores can be made using borate and tartrate baths since aluminum oxide is insoluble in these solutions. Besides aluminum oxide, titanium oxide, titanium nitride and tantalum pentoxide (used in tantalum capacitors) dielectric films are possible. These metals and anodic films may generally be compatible with thin film processing.

Further examples of inorganic electrically insulating coatings include silicon dioxide, silicon oxy nitride, and silicon nitride thin films. Such films can be formed by chemical vapor deposition or sputter deposition.

Figure 5:
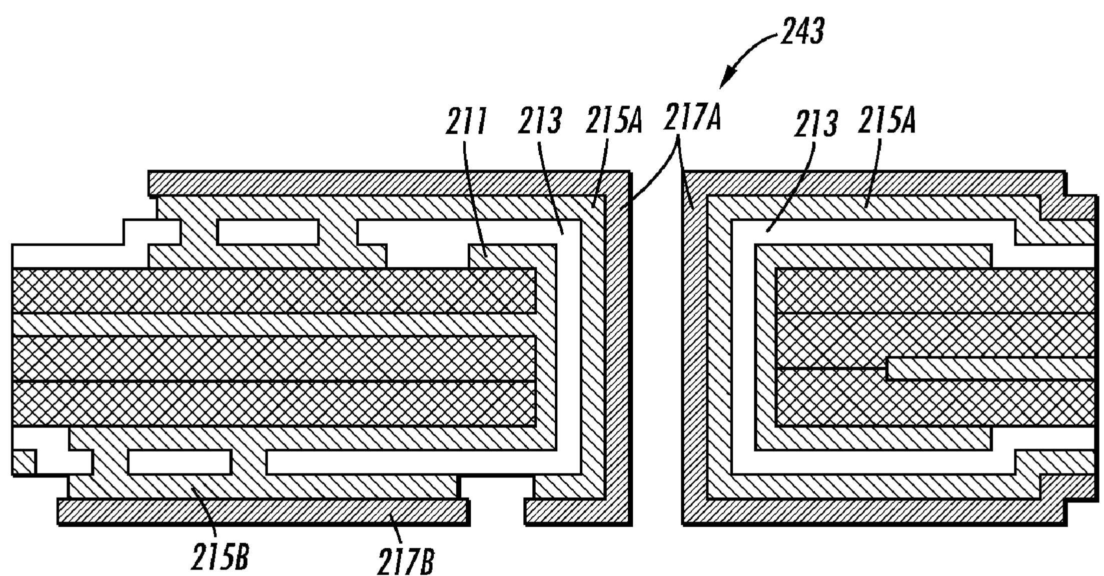
FIG. 5 is a schematic view of a further embodiment of a via structure that is configured for electrical and fluidic interconnection.

Referring now to FIG. 5, the via structure 243 can comprise a first electrically conductive layer 211 disposed in an opening in the circuit carrying substrate 143, for example extending from a first side to second side of the circuit carrying substrate 143, a dielectric or electrically insulating layer 213 disposed on the first electrically conductive layer 211, and a second electrically conductive layer 215A, 215B disposed on the electrically insulating layer 213. The second electrically conductive layer 215A, 215B includes a first portion 215A that extends from the first side to the second side of the printed circuit board, and a second portion 215B disposed on the second side of the printed circuit board and electrically isolated from the first portion 215B of the second electrically conductive layer 215A, 215B. The second portion 215B of the second electrically conductive layer is electrically connected to the first electrically conductive layer 211. A third electrically conductive layer 217A, 217B can be formed on the second electrically conductive layer 215A, 215B in such a manner that second portions 215B, 217B are electrically isolated from the first portions 215A, 217A which are electrically connected to the first electrically conductive layer 211. The portion 217B of the third electrically conductive layer 217A, 217B disposed on the second portion 215B of the second electrically conductive layer 215A, 215B can comprise a contact pad for electrical interconnection.

By way of illustrative examples, the first and second conductive layers can comprise copper while the third conductive layer can comprise nickel. More generally, the third electrically conductive layer can comprise a material that is different from the material of the second electrically conductive layer.

Depending upon the particular needs, the third electrically conductive layer can be omitted, and in such implementations, an appropriate exposed portion of the second portion 215B of the electrically conductive layer 215A, 215B can comprise a contact pad.

Figure 6:
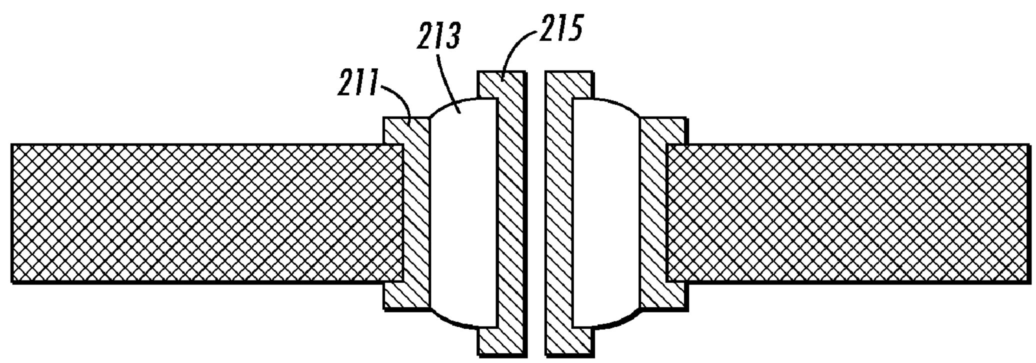
FIG. 6 is a schematic view of another embodiment of a via structure that is configured for electrical and fluidic interconnection.

Referring now to FIG. 6, schematically illustrated therein is via structure that includes a first conductive layer 211, a drilled electrically insulating or dielectric layer 213 disposed on the first conductive layer 211, and a second conductive layer 215 disposed on the drilled electrically insulating layer 213. The second conductive layer 215 can comprise first and second electrically isolated portions as described above relative to FIG. 5, wherein one of such portions can be electrically connected to the first electrically conductive layer. A third conductive layer can be optionally formed on the second conductive layer 215 as described above relative to FIG. 5.

By way of illustrative example, the via structure can be implemented by mechanical or laser drilling a via or opening in the printed circuit board, forming the first conductive layer 211 (for example by plating), filling the plated via with an electrically insulating material such as epoxy, drilling the filled via to form the electrically insulating layer 213, and forming the second conductive layer 215 (for example by via plating).

The disclosed via structures can be implemented using a variety of processes including for example printed circuit board techniques, flex circuit manufacturing techniques, thick film processes, or thin film processes.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

What is claimed is:

1. A drop generator comprising:

a pressure chamber defined by a chamber wall structure;

a diaphragm plate disposed on the chamber wall structure and covering the pressure chamber;

an electromechanical transducer attached to the diaphragm plate; and a via structure electrically connected to the electromechanical transducer and fluidically connected to the pressure chamber, the via structure including an electrically conductive layer that extends from one side of a circuit carrying substrate through the circuit carrying substrate to a second side of the circuit carrying substrate, and an electrically insulating layer disposed on the electrically conductive layer.

2. The drop generator of claim 1 wherein the diaphragm plate comprises metal.

3. The drop generator of claim 1 wherein the electrically insulating layer comprises a conformal coating.

4. The drop generator of claim 1 wherein the electrically insulating layer comprises Parylene.

5. The drop generator of claim 1 wherein the electrically insulating layer comprises annealed Parylene.

6. The drop generator of claim 1 wherein the electrically insulating layer comprises polytetrafluorethylene.

7. The drop generator of claim 1 wherein the electrically insulating layer comprises polyurethane.

8. The drop generator of claim 1 wherein the electrically insulating layer comprises an anodic metal oxide.

9. The drop generator of claim 1 wherein the electrically insulating layer comprises epoxy.

10. A drop generator comprising:

a pressure chamber defined by a chamber wall structure;

a diaphragm plate disposed on the chamber wall structure and covering the pressure chamber;

an electromechanical transducer attached to the diaphragm plate; and a via structure electrically connected to the electromechanical transducer and fluidically connected to the pressure chamber, the via structure including a first electrically conductive layer that extends from one side of a circuit carrying substrate through the circuit carrying substrate to a second side of the circuit carrying substrate, an electrically insulating layer disposed on the first electrically conductive layer, and a second electrically conductive layer disposed on the electrically insulating layer.

11. The drop generator of claim 10 wherein the diaphragm plate comprises metal.

12. The drop generator of claim 10 wherein the second electrically conductive layer includes a first portion and a second portion that is electrically isolated from the first portion, and wherein the first portion is electrically connected to the first electrically conductive layer.

13. The drop generator of claim 10 wherein the electrically insulating layer comprises a conformal coating.

14. The drop generator of claim 10 wherein the electrically insulating layer comprises Parylene.

15. The drop generator of claim 10 wherein the electrically insulating layer comprises annealed Parylene.

16. The drop generator of claim 10 wherein the electrically insulating layer comprises polytetrafluorethylene.

17. The drop generator of claim 10 wherein the electrically insulating layer comprises polyurethane.

18. The drop generator of claim 10 wherein the electrically insulating layer comprises an anodic metal oxide.

19. The drop generator of claim 10 wherein the electrically insulating layer comprises epoxy.

* * * * *